US008058111B2

(12) United States Patent
Langguth et al.

(10) Patent No.: US 8,058,111 B2
(45) Date of Patent: Nov. 15, 2011

(54) INTEGRATED CIRCUIT ARRANGEMENT COMPRISING A PIN DIODE, AND PRODUCTION METHOD

(75) Inventors: Gernot Langguth, Oberhaching (DE); Karlheinz Mueller, Velden (DE); Holger Wille, Bad Abbach (DE)

(73) Assignee: Infineon Technologies AG, Neubiberg (DE)

( * ) Notice: Subject to any disclaimer, the term of this patent is extended or adjusted under 35 U.S.C. 154(b) by 415 days.

(21) Appl. No.: 12/351,623

(22) Filed: Jan. 9, 2009

(65) Prior Publication Data
US 2009/0209057 A1 Aug. 20, 2009

Related U.S. Application Data

(60) Division of application No. 11/647,550, filed on Dec. 28, 2006, now Pat. No. 7,495,306, which is a continuation-in-part of application No. PCT/EP2005/052809, filed on Jun. 17, 2005.

(30) Foreign Application Priority Data

Jun. 30, 2004 (DE) .......................... 10 2004 031 606

(51) Int. Cl.
*H01L 21/20* (2006.01)
(52) U.S. Cl. ...................... 438/141; 257/458; 257/462

(58) Field of Classification Search .................. 257/187, 257/192, 195, 197, 198, 290–293, 458, 459, 257/254, 461, 462, 517, 548, E31.057, E27.133; 438/141
See application file for complete search history.

(56) References Cited

U.S. PATENT DOCUMENTS

| 6,380,603 B1 | 4/2002 | Takimoto et al. |
| 2004/0097031 A1 | 5/2004 | Lee et al. |

FOREIGN PATENT DOCUMENTS

| EP | 0 353 509 A1 | 7/1989 |
| EP | 0 778 621 A2 | 12/1996 |
| EP | 1 333 499 A2 | 1/2003 |
| JP | 02 238664 | 9/1990 |
| WO | WO 02/33755 A2 | 4/2002 |
| WO | WO 2004/025739 A2 | 3/2004 |

OTHER PUBLICATIONS

Non-certified English translation of the German Office Action dated May 30, 2005.
German Office Action dated May 30, 2005 [cited in Applicants' Information Disclosure Statement filed on Dec. 28, 2006].
Japanese Office Action (English Translation) dated Jun. 1, 2010, Patent Application No. 2007-518581—(9 pgs).

*Primary Examiner* — David Vu

(57) ABSTRACT

An integrated circuit arrangement includes a pin photodiode and a highly doped connection region of a bipolar transistor. A production method produces an intermediate region of the pin diode with a large depth and without auto-doping in a central region.

1 Claim, 3 Drawing Sheets

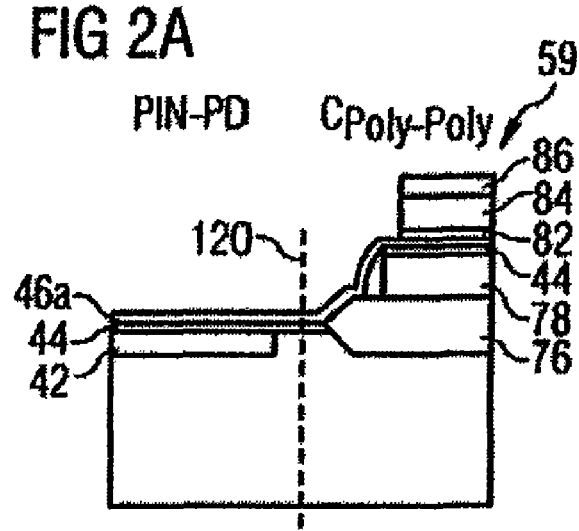
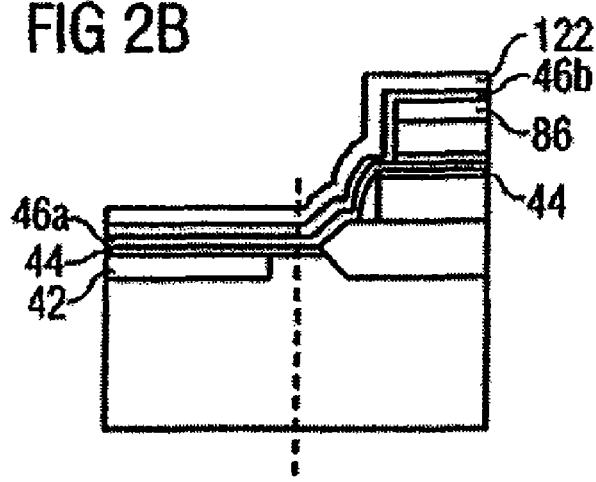
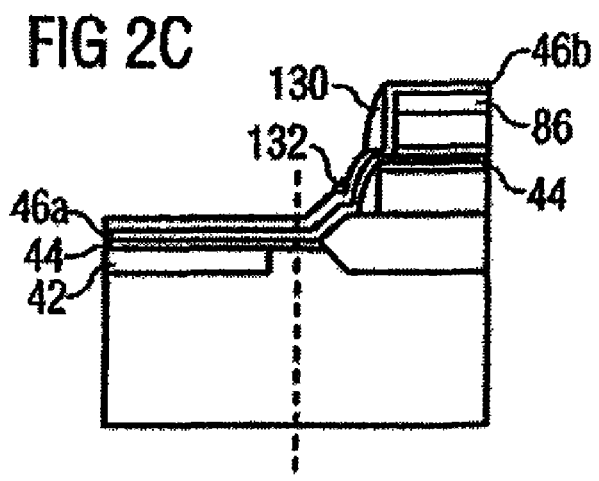

INTEGRATED CIRCUIT ARRANGEMENT COMPRISING A PIN DIODE, AND PRODUCTION METHOD

PRIORITY CLAIM

This application is a divisional application of U.S. application Ser. No. 11/647,550, filed Dec. 28, 2006, now U.S. Pat. No. 7,495,306 which is a continuation-in-part of International Patent Application No. PCT/EP2005/052809, filed Jun. 17, 2005, and claims the benefit of priority of German Patent Application No. DE 10 2004 031 606.6, filed Jun. 30, 2004, all of which are incorporated herein by reference in their entirety hereby.

BACKGROUND

1. Technical Field

The present invention relates to an integrated circuit arrangement with a diode. In particular, the present invention relates to an integrated circuit arrangement with a pin diode and a corresponding production method.

2. Background Information

A pin diode is a diode having a layer sequence p, i and n, p denoting a highly p-doped region, i denoting an intrinsically conducting or intrinsic or else only weakly n-doped or p-doped intermediate region and n denoting a highly n-doped region. The pin junction differs from a pn junction, in particular, by virtue of the intrinsic or weakly doped intermediate region. As a result of the fact that the reverse current through the pin diode primarily depends on the charge generation in the i zone, this diode is used as a radiation detector, for example in nuclear technology, or as a pin photodiode, in particular for detecting light in the wavelength range of between approximately four hundred nanometers and approximately one micrometer. In particular, pin diodes have high sensitivity and a high detection speed.

Integrated pin diodes have a wider possible frequency bandwidth than individual semiconductor components since they are directly monolithically connected to integrated circuits. In particular, there is no need for any bonding wires between the pin diode and a preamplifier, with the result that radio-frequency applications at frequencies of greater than 500 megahertz or greater than 1 gigahertz can be realized using silicon, for example in optical telecommunication with the aid of glass fibers or plastic fibers or in optical data storage. The pin diode is integrated, in particular, in a Bipolar Complementary Metal Oxide Silicon (BICMOS) circuit. The pin diode is sensitive, in particular, to light in the range from 400 nanometers to 800 nanometers and is thus sensitive to light of a wide bandwidth.

BRIEF SUMMARY

It is an object of the invention to specify an integrated circuit arrangement which is of simple design, has a pin diode and is, in particular, highly sensitive and suitable for radio-frequency applications. Methods for producing pin diodes are also disclosed.

The invention is based on the consideration that a wide bandwidth of the photodiode is primarily achieved by virtue of: a small product of series resistance Rs and junction capacitance Cpd. The smaller the product of Rs*Cpd, the wider the bandwidth. The main cause of the charge carriers moving must be drift, that is to say acceleration as a result of an electric field. Therefore, the space charge zone should completely penetrate the absorption zone or the intermediate region of the pin diode. In pin diodes, the space charge zone can be produced using a comparatively small reverse voltage Charge carrier diffusion which is considerably slower than the drift results when field-free zones occur in the intermediate region. The charge carrier diffusion results in a gentler edge steepness of an electrical signal and thus in a reduction in the switching times.

The light sensitivity can be increased by: a considerable depth of the intermediate region, for example greater than or equal to 10 micrometers, an antireflection coating and further measures for increasing the proportion of light injected into the pin diode For radio-frequency applications having mixed signals, that is to say with analog signal processing and with digital signal processing, the production process should make it possible, inter alia, to produce the following components in an integrated circuit: vertical NPN transistors having a cut-off frequency of greater than 15 GHz, vertical PNP transistors, CMOS transistors, and passive components such as resistors and capacitors.

The production process may make it possible to use methods which are most suitable for the respective component. In addition, as many process steps as possible should be used for the simultaneous production of different types of components to reduce the total number of steps. Highly doped buried collector connection layers and comparatively thin epitaxial layers should be used for the radio-frequency (RF) bipolar transistors. On the other hand, a high-impedance epitaxial layer which is considerably thicker than the epitaxial layer for the RF bipolar transistor is for the intermediate layer of the pin diode.

One possibility is to select a compromise thickness for the epitaxial layer but both the light sensitivity of the pin diode and the operating properties of the bipolar transistor, for example the transition frequency, would be impaired.

Another possibility is to interrupt the epitaxy to produce the collector connection layer at a small depth and then to continue the epitaxy, so that a double epitaxial layer is produced. The deep intermediate zone ensures high light sensitivity of the pin diode. The operating properties of the bipolar transistor are not impaired either. However, an autodoping process, in which dopants from the highly doped buried connection region pass into the intermediate layer of the pin diode and considerably impair the radio-frequency properties of the latter, occurs when continuing the epitaxy.

Therefore, the invention uses a thick epitaxial layer which is produced in a single-stage epitaxy process, and the buried connection region is produced using an implantation method after the epitaxial layer has been produced for the entire intermediate region. High-energy implantation also makes it possible to subsequently introduce the connection region to a depth of more than 700 nanometers or more than one micrometer. However, the connection region does not begin at a depth of more than one micrometer or two micrometers. In one refinement, the implantation energy is in the range from 500 KeV to 1500 KeV.

An integrated circuit arrangement is produced having a pin diode, a doped region of one conduction type, for example a p-type region, which region is contained in the pin diode and is near a surface, a doped region of a conduction type other than the conduction type of that region of the pin diode which is near the surface, for example a buried n-type region, which region is contained in the pin diode and is remote from the surface, an intermediate region which is contained in the pin diode, is arranged between the region which is near the surface and the region which is remote from the surface, and is undoped or is provided with doping which is weak in comparison with the doping of that region of the pin diode which is near the surface, a bipolar transistor which is near the surface, a base region which is contained in the bipolar transistor and is p-doped in the case of an npn transistor and is n-doped in the case of a pnp transistor, an edge region, for example an emitter region, which is contained in the bipolar transistor, adjoins the base region and is near the surface, an edge region, for example a collector region, which is contained in the bipolar transistor, adjoins the base region and is remote from the surface, and a connection region which is doped more heavily than that edge region of the bipolar transistor which is remote from the surface and is arranged on that side of the edge region—that is remote from the surface—which is remote from the surface.

The intermediate region includes a constant dopant concentration profile in a section which begins at a depth at which the connection region also begins and ends at a depth at which the connection region also ends or having a dopant concentration profile which changes by less than one order of magnitude.

In one development, the boundary between that region of the pin diode which is remote from the surface and the intermediate region is at a boundary depth of at least 8 micrometers or at least 10 micrometers from the surface. That edge region of the transistor which is remote from the surface extends to a maximum depth from the surface of less than $\frac{1}{3}$ or less than $\frac{1}{5}$ of the boundary depth. Despite a comparatively thick epitaxial layer, this produces a bipolar transistor having excellent operating properties, in particular a low-value collector connection resistance and a small collector capacitance. In one refinement, that boundary of the connection region which is near the surface is at a depth of less than 1.5 micrometers.

In another development, the intermediate layer and the connection region are arranged in a monocrystalline layer, in particular in an epitaxial layer which is produced with a different dopant concentration to the substrate and, apart from an edge region, is, in particular, produced with a homogeneous dopant concentration. The surface, to which reference is made when mentioning depths, is preferably an interface of the monocrystalline layer.

In another development, the circuit arrangement contains a substrate having a homogeneous dopant concentration or contains an undoped substrate, in particular a silicon substrate. In a next development, the epitaxial layer has, at the end of the production process, a different dopant concentration and/or a different conduction type to the substrate in the region of the pin diode.

The invention also relates to a method for producing the circuit arrangement according to the invention or one of its developments, with the result that the abovementioned technical effects also apply to the method. Irrespective of the list order, the method includes producing a doped region for a pin diode in a substrate, producing an epitaxial layer having a thickness of at least 5 or at least 8 micrometers after the region for the pin diode has been produced, in particular without interrupting the epitaxy and without carrying out further epitaxy, implanting a buried layer for a collector connection region of a bipolar transistor after the epitaxial layer has been produced, producing another doped region of the pin diode, and producing a bipolar transistor, which contains a collector region that adjoins the collector connection region, in the epitaxial layer.

In a second aspect, the invention also relates to a simple method for producing an integrated circuit arrangement, in particular the circuit arrangement according to the invention or one of its developments. The method according to the second aspect includes producing a topology containing at least one step which is adjoined by material to be protected, producing a protective layer which also covers the step, producing a spacer element layer after the protective layer has been produced, anisotropically etching the spacer element layer with the production of a spacer element or spacer at the step, thinning or completely removing the protective layer in regions which are not covered by a spacer element, at least one remaining region of the protective layer remaining on the material to be protected, applying a useful layer after the protective layer has been thinned or removed, patterning the useful layer with simultaneous removal of the spacer element, the material to be protected being protected by the remaining region, when producing an integrated circuit arrangement.

The method can be used for many applications in which material to be protected is deliberately covered with a protective layer at steps before a useful layer is patterned. In particular, the spacers can be removed during patterning because the remaining region which has not yet been thinned or removed affords sufficient protection for the protective layer.

In one development of the method according to the second aspect, after thinning of the protective layer has ended, a partial layer of the protective layer remains in regions which are not covered by a spacer element. Patterning is effected selectively with respect to the partial layer, with the result that the partial layer is used as an etching stop layer and a layer which is under the protective layer is not damaged.

In a next development of the method according to the second aspect, the material to be protected, the material of the spacer element layer and the material of the useful layer contain at least one identical material constituent, in particular nitrogen bound in silicon nitride or oxynitride, for example. Alternatively, said materials are identical materials, in particular silicon nitride. In the two alternatives, complicated patterning processes can be carried out in a simple manner and, in particular, with few process steps using only few materials or using similar materials.

In a next development, the protective layer is an oxide layer, in particular a silicon oxide layer such as a thermal oxide layer or a TEOS layer. Patterning selectively with respect to oxide layers is well controlled, with the result that the method can be carried out with a high yield, in particular even in the case of thin protective layers.

In a next development, the useful layer is patterned wet-chemically, preferably using a hard mask and/or using phosphoric acid. This makes it possible to pattern the useful layer at high etching rates, with a low outlay in terms of apparatus and without damaging the wafer, as may be caused by a plasma, for example.

In other developments, the material to be protected is contained in: a dielectric of a capacitor, in particular a capacitor in which one electrode or both electrodes contain(s) polycrystalline silicon or comprise(s) polycrystalline silicon, a charge-storing layer of a memory transistor, in particular in a layer which is electrically insulated on all sides, or in a spacer element to the side of the gate electrode of a field effect transistor or in the gate dielectric of a field effect transistor.

In all three cases, in one refinement, the material to be protected is part of an Oxide-Nitride-Oxide or Oxynitride (ONO) layer stack, in particular part of the nitride-containing layer or layers of such a stack. However, in alternative developments, single nitride layers also need to be protected from etching attacks in the three components mentioned.

In a next development, the useful layer covers a light-sensitive element, in particular a pin diode, a pn photodiode or a Charge Coupled Device (CCD) element. In one development, the useful layer is in the form of an antireflection layer.

In one refinement, nitride-containing materials are used as the antireflection layer. During patterning, other components having nitride-containing partial regions or partial regions comprising nitride are effectively protected by the protective layer. This also applies when the spacer element likewise contains nitride or comprises a nitride.

In another development, the light-sensitive element is covered by a layer stack which contains, in the order stated and with increasing distance from the light-sensitive element: a thermal oxide layer, a deposited oxide layer, and the useful layer.

The layer stack results in a highly sensitive photoelement because a very large amount of incident light is injected.

BRIEF DESCRIPTION OF THE DRAWINGS

Exemplary embodiments of the invention are explained below with reference to the accompanying drawings, in which:

FIGS. 2A to 2F show production stages when producing the integrated circuit arrangement.

DETAILED DESCRIPTION

Figure 1:
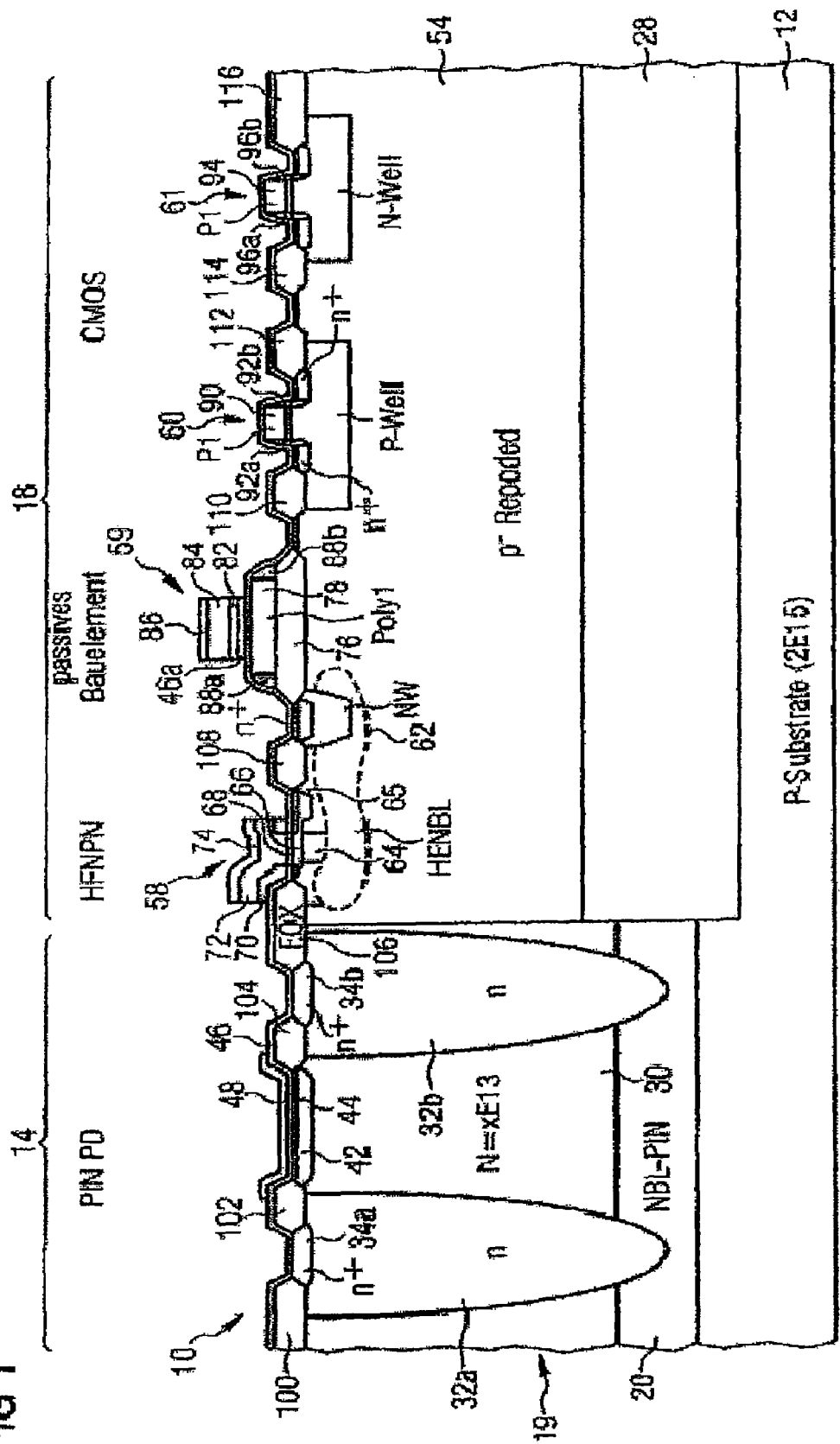
FIG. 1 shows an integrated circuit arrangement having a pin diode.

FIG. 1 shows an integrated circuit arrangement 10 which contains a p-doped substrate region 12 having a dopant concentration of, for example, 2 1015 doping atoms per cubic centimeter, a pin photodiode 14 and a circuit region 18. The substrate region 12 is contained, for example, in a semiconductor wafer, for example in a silicon wafer or in a silicon platelet or chip. A buried n+-type region 20 was produced in the substrate and in an epitaxial layer 19 using, for example, the method explained in more detail below, n+ denoting a high dopant concentration of a dopant which results in an n conduction type, that is to say of arsenic or phosphorus, for example. The region 20 adjoins the substrate region and has a thickness of one micrometer, for example. A buried p+-type region 28 is situated under the circuit region 18 in the same plane as the region 20. The region 28 adjoins the substrate region 12 and also the region 20. The region 28 is likewise situated in the substrate and in the epitaxial layer 19. In the exemplary embodiment, the region 28 is thicker than the region 20 and has, for example, a thickness of several micrometers, for example at least 2 micrometers.

The region 20 belongs to the photodiode 14 which has an extent of fifty micrometers in the lateral direction, for example. An intermediate region 30 of the photodiode 14, which is weakly n-doped, that is to say n--doped with a dopant concentration of, for example, $1 \times 10^{13}$ dopant atoms per cubic centimeter, is situated above the region 20 such that it adjoins the latter. The intermediate region 30 was formed in the epitaxial layer 19 and has a thickness of greater than 5 micrometers. Alternatively, a weakly p-doped region 30 or an undoped region 30 is used. The intermediate region 30 is laterally completely surrounded by a connection region which is, for example, annular and of which two partial regions 32a and 32b are illustrated in FIG. 1. The connection region and thus also the partial regions 32a and 32b are n-doped but with a higher dopant concentration than the intermediate region 30.

At its section which is remote from the substrate, the connection region adjoins a highly doped region which is likewise annular and of which two sections 34a and 34b are illustrated in FIG. 1. The highly doped region and thus also the sections 34a and 34b are n+-doped to ensure a low contact resistance with respect to the connection region. Interconnects which are not illustrated penetrate one or more metalization layers of the integrated circuit arrangement 10 and lead to the section 34a or 34b of the connection region.

A p+-doped region 42 which forms the anode of the photodiode 14 adjoins the intermediate region 30 on that side of the intermediate region 30 which is remote from the substrate 12. An interconnect which is not illustrated is connected to the region 42.

A recess which is not illustrated and through which light passes to the photodiode 14 to influence the electrical properties of the latter is situated above the region 42 in the metallization layers. So that incident light can penetrate the photodiode 14 as fully as possible, a matching layer stack, for example a triple layer stack comprising: a thermal oxide layer 44 which adjoins the region 42 and has a layer thickness of, for example, a few nanometers, for example in the range from 3 to 10 nanometers, of 4.5 nanometers in this case, a tetraethylorthosilicate (TEOS) oxide layer region 46 which adjoins the thermal oxide layer 44, the oxide layer 46 having a thickness in the range from 3 to 15 nanometers, in particular a thickness of 5 nanometers, and a nitride layer region 48 which adjoins the oxide layer 44 and has, for example, a thickness in the range from 30 to 50 nanometers, in particular a thickness of 40 nanometers, is applied to the pin diode 14 in the region of the recess.

The thermal oxide layer 44 improves the surface properties of the region 42 as a result of a reduction in the surface recombination. The oxide layer region 46 and the nitride layer region 48 have optical effects and reduce the reflection of the light impinging on the pin diode 14.

A weakly p-doped region 54 is situated beside the intermediate region 30 in the epitaxial layer 19. The region 54 adjoins the region 28 and extends as far as the surface of the epitaxial layer 19. The region 28 thus connects the region 54 to the substrate 12 in an electrically conductive manner.

A multiplicity of active and passive components, of which an npn transistor 58, a capacitor 59, an n-channel transistor 60 and a p-channel transistor 61 are illustrated in FIG. 1, are situated in the epitaxial layer 19 in the circuit region 18. The npn transistor 58 contains a buried collector connection region 62 which is heavily n-doped, that is to say n+-doped, and leads to a Selectively Implanted Collector (SIC) collector region 64, that is to say a collector which is produced in a self-aligning manner by means of implantation under an emitter opening. Alternatively, a broader collector region 64 is used. The collector region 64 is more heavily n-doped than a region 65 which surrounds it and is weakly doped, that is to say n--doped. The collector region 64 is, for example, doped to the same extent as the connection region 62 or is doped more weakly than this connection region 62. A base region 66 which is heavily p-doped and an emitter region 68 which is heavily n-doped are situated above the collector region 64.

The oxide layer 44 or the TEOS layer 46 and a nitride layer region 70 each contain, above the emitter region 68, a recess through which a polycrystalline emitter connection electrode 72, which is used to connect the emitter region 68, extends. An oxide region 74 which has been used as a hard mask when patterning the connection electrode 72 and is removed in another exemplary embodiment optionally adjoins the connection electrode 72 above the latter. The oxide region, the connection electrode 72 and the nitride layer region 70 were patterned with the aid of a photolithographic method and a joint etching step.

The capacitor 59 is arranged in a field oxide region 76 or Shallow Trench Isolation (STI) and contains, in the following order and with increasing distance from the field oxide region 76: a polycrystalline bottom electrode 78 comprising silicon, the oxide layer 44, part of the TEOS layer 46, a nitride layer region 82, a polycrystalline covering electrode 84 comprising silicon, and an optional oxide region 86 comprising silicon dioxide, for example.

Spacer regions 88a and 88b of an oxide spacer that surrounds the bottom electrode 78 are arranged to the side of the bottom electrode 78. The oxide region 86, the covering electrode 84 and the nitride layer region 82 were patterned using the same photolithographic method which was also used to pattern the oxide region 74, the connection electrode 72 and the nitride layer region 70.

The field effect transistor 60 is arranged in a p-type well and has a customary design. By way of example, a gate electrode 90 and oxide spacers 92a and 92b, which are arranged to the side of the latter, are provided with reference symbols. In contrast, the field effect transistor 61 is arranged in an n-type well and likewise has a customary design. By way of example, a gate electrode 94 and oxide spacers 96a and 96b, which are arranged to the side of the latter, are provided with reference symbols. The gate electrodes 90 and 94 and the spacers 92a, 92b, 96a and 96b are covered with the TEOS layer 46.

The bottom electrode 78 and the gate electrodes 90 and 94 were produced from the first polycrystalline layer Poly1 which was applied for the purpose of producing the circuit arrangement 10. In contrast, the connection electrode 72 and the covering electrode 84 were produced from a second polycrystalline layer Poly2 which was applied after the first polycrystalline layer Poly1 had been applied and patterned, after the spacers 88a, 88b, 92a, 92b, 96a and 96b had been produced, after the oxide layer 44 had been applied and after the nitride layer had been applied and from which the nitride layer region 70 and the nitride layer region 82 were produced.

FIG. 1 also illustrates further field oxide regions (or STIs) 100 to 116 which comprise, for example, silicon dioxide (or TEOS) and electrically insulate individual components or functional units of components from one another.

When producing the circuit arrangement 10, the process begins, for example, with a p-doped substrate 12. The n-doped buried layer 20 is implanted as a cathode in the region for the photodiode 14. A p-doped layer 28 is implanted in the circuit region 18, a self-aligning process preferably being used. The single-stage epitaxy for producing the epitaxial layer 19 is then carried out, a low dopant concentration of, for example, 1013 dopant atoms per cubic centimeter being produced in situ. The epitaxial layer 19 is formed, without interruption, with a thickness of greater than 5 micrometers but preferably of less than 30 micrometers to produce the intermediate region 30 or the i region of the pin diode 14.

In the exemplary embodiment for epitaxial thicknesses of up to 15 micrometers, the cathode contact 32a, 32b is produced by phosphorus implantation followed by out-diffusion at a high temperature in the range, for example, from 1000 degrees Celsius to 1200 degrees Celsius for a period in the range from 150 minutes to 500 minutes.

The same high-temperature step is used in the exemplary embodiment for producing light p-doping in the region 54, that is to say in the circuit region 18 of the epitaxial layer 19. The same dopant concentration as in the P-type substrate 12 is thus produced in the circuit region 18 in the vicinity of the surface.

Alternatively, however, the cathode contact is produced using trenches. The connection regions 32a and 32b are then produced not by means of diffusion but rather in deep trenches on whose trench wall an insulating layer, for example a silicon dioxide layer, is produced and into which doped polysilicon or else a metal is then introduced. In this alternative exemplary embodiment, the thickness of the epitaxial layer can be increased further, for example to more than 15 micrometers, with the result that the sensitivity of the pin diode is increased while the radio-frequency properties remain approximately the same.

Only then is the high-energy implantation for the collector connection region 62 carried out, with the result that autodoping is avoided in a central region of the intermediate layer. In the exemplary embodiment, the method steps for producing the CMOS components 60, 61 and the passive components 59 and also for producing the bipolar transistors 58 are the known method steps or the method steps which are carried out as standard.

FIGS. 2A to 2F show production stages when producing the integrated circuit arrangement 10, in particular in connection with the application of the nitride layer region 48 which is used as an antireflection layer.

At the end of the Front End Of Line (FEOL) process, after the semiconductor components 58, 60, 61 have been produced but before the first metallization layer is produced, an antireflection layer 44/46, 48 is applied to the photodiode 14 which comprises a lower oxide layer region 44 and 46 and an upper nitride layer region 48 which adjoins the latter. In the exemplary embodiment, a thermal oxide layer 44 is used as an interface layer to reduce the surface recombination.

The thickness of the oxide/nitride double layer 44/46, 48 is optimized to minimum reflection for the wavelength of the light to which the pin diode is intended to be sensitive. Silicon nitride cannot be directly deposited and patterned because there are still other exposed nitride regions, for example the nitride layer region 70 or 82. In addition, the thermal oxide layer 44 protects the bottom electrode 78, the gate electrodes 90 and 94 and the adjoining spacers only to an insufficient extent especially since the spacers may also comprise silicon nitride. The sequence of method steps explained below is therefore carried out.

FIG. 2A shows the anode region 42 of the pin diode and the capacitor 59, the region lying between them not being illustrated, which is indicated using a dashed vertical line 120. FIG. 2A shows the circuit arrangement 10 immediately after the polycrystalline silicon Poly2 has been patterned. The anode region 42 is covered by the thermal oxide layer 44 and by a silicon dioxide layer having a thickness of, for example, 12 nanometers.

As is illustrated in FIG. 2B, a protective layer 46b, for example a silicon dioxide layer, is then conformally deposited with a layer thickness in the range from 30 to 60 nanometers, with a layer thickness of, for example, 40 nanometers in this case, using a TEOS method. The protective layer 46b is intended to horizontally and vertically protect the nitride region 82, inter alia. The protective layer 46b also protects the oxide layers 44 and 46a in the region of the capacitor 59 from the effects of the method steps explained further below.

As is illustrated in FIG. 2B, after the protective layer 46b has been applied over the entire area, a spacer element layer 122, for example a silicon nitride layer, is applied with a layer thickness in the range from 100 nanometers to 200 nanometers, with a layer thickness of, for example, 150 nanometers in this case, using a Low Pressure Chemical Vapor Deposition (LPCVD) method.

As is further illustrated in FIG. 2C, the spacer element layer 122 is then etched using an anisotropic etching method, for example using a Reactive Ion Etching (RIE) method, spacer elements or spacers being produced at steps, see spacer element 130, for example. During anisotropic etching, the protective layer 46b is used as a stop layer and is exposed in planar regions and is thinned from, for example, 40 nanometers to 20 nanometers. Remnants 132 of the spacer element layer 122 remain at smaller steps. However, these remnants do not interfere any further, as results from the following explanations.

Figure 2D:
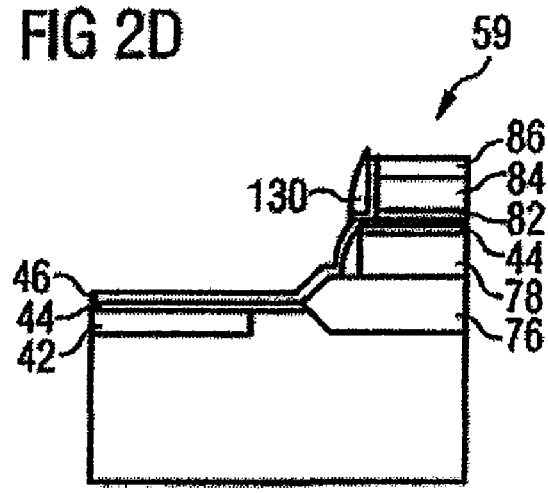

As is illustrated in FIG. 2D, the protective layer 46b is then removed in regions which are not covered by spacer elements 130 and which do not directly adjoin a spacer element 130. In the exemplary embodiment, after the protective layer 46b has been removed, the oxide layer 44/46 has a thickness of, for example, 9.5 nanometers. The spacer element 130 thus projects by, for example, more than 30 nanometers beyond that surface of the oxide layer 46 in the oxide region 86 which is parallel to the substrate 12. The protective layer 46b is removed, for example, anisotropically, in particular wet-chemically, for example using hydrofluoric acid HF. Undercutting of the spacer element 130 within certain limits is accepted since the lateral extent at the base of the spacer element is greater than the layer thickness of the protective layer 46b, in particular is more than twice as large.

In contrast, in another exemplary embodiment, the protective layer 46b is only selectively thinned with respect to the spacer element 130, for example by more than half its original thickness, but the protective layer 46b is not etched through at any point. The target thickness for thinning is, for example, in the range from 5 to 15 nanometers.

In contrast, even after removal or thinning, the protective layer 46b has its original thickness of, for example, 40 nanometers under the spacer element 130 and between the spacer element 130 and the covering electrode 84 or the nitride region, with the result that it has a particularly good protective effect here even if the spacer element 130 should be removed. When removing the protective layer 46b, the oxide layer 46a is also thinned, for example by 2 nanometers, the layer 46 being produced. The thickness of the oxide layer 44/46 is set in such a manner that reflection of light when entering the pin diode is minimized.

Figure 2E:
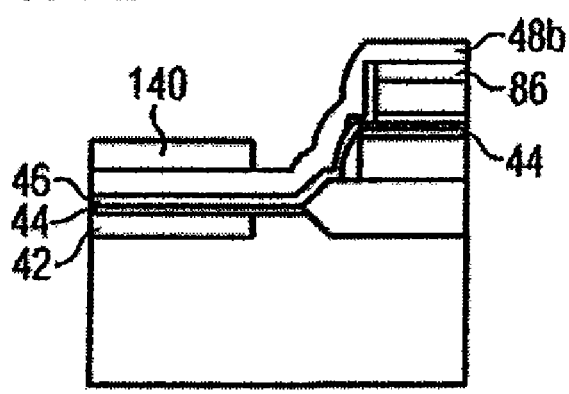

As is illustrated in FIG. 2E, after the exposed regions of the layer 46b have been removed, a layer 48b, from which the antireflection layer or the nitride layer region 48 is intended to be produced, is deposited. In the exemplary embodiment, the layer 48b comprises silicon nitride, its thickness being matched to the light wavelength of the application. The layer thickness of the layer 48b is in the range from, for example, 30 nanometers to 60 nanometers. The layer 48b is deposited on the thinned oxide layer 44/46. In the exemplary embodiment, the silicon nitride layer 48b has a layer thickness of 40 nanometers. The spacer element 130 thus comprises the same material as the layer 48b and becomes part of this layer 48b.

After the layer 48b has been deposited, a hard mask layer, for example a TEOS hard mask layer, is applied and patterned, a hard mask 140 being produced above the region 42. The hard mask 140 is produced from the hard mask layer with the aid of a photolithographic method and an etching process. For example, the hard mask layer 48 comprises silicon dioxide. When patterning the hard mask layer, the process is stopped at the layer 48b. The thickness of the hard mask layer is selected in such a manner that the layer 48b can be completely patterned without etching through the hard mask in the process.

Figure 2F:
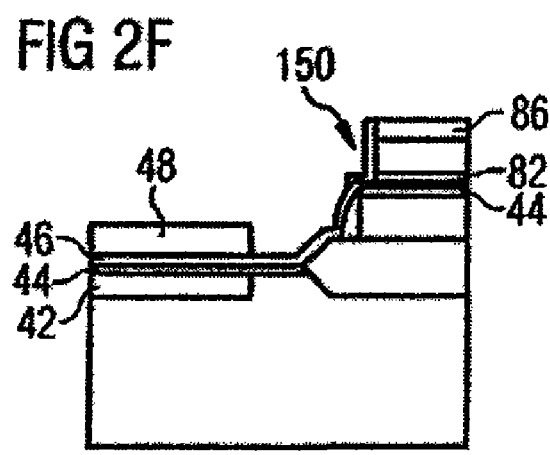

FIG. 2F shows a production stage after the layer 48b has been patterned with the aid of the hard mask 140 in, for example, a wet-chemical and thus isotropic process, for example using phosphoric acid, and after the hard mask 140 has been removed. The nitride layer region 48 which acts as an antireflection layer is now produced under the region in which the hard mask 140 was situated. When patterning the nitride layer 48b, the spacer element 130 is also removed. However, an L-shaped thickened region 150 of the oxide layer 46, for example, affords sufficient protection for the nitride layer region 82 from the etching bath. The L-shaped region 150 covers the bottom and the side area of the step at which the spacer element 130 was also arranged. During the wet-chemical etching process, the process is thus stopped at the oxide layer 46.

At the end of the Back End Of Line (BEOL) process, after the metallization layers have been produced, a nitride passivation layer which is finally applied is removed again above the pin diode 14 to minimize optical interference effects in the application. Use is made of the same mask as is also used to pattern the connection pads, so that an additional mask is not required here.

A pin diode having a bandwidth of one gigahertz at an operating voltage of 2.5 volts and a wavelength of the incident light of 650 nanometers is produced. The light sensitivity values achieved are 0.25 A/W (amperes per watt) at a wavelength of 405 nanometers, 0.4 A/W at a wavelength of 650 nanometers, and 0.35 A/W at a wavelength of 780 nanometers.

The following technical effects result: simple method control in which only one epitaxy process is required, in which only 4 additional photomasks are required for the production of the pin diode and in which only 3 additional photomasks are required for the production of the radio-frequency NPN transistor 58; a small operating voltage of the pin diode 14 of, for example, less than 3 volts, in particular of 2.5 volts; a small p/n junction capacitance of the pin diode of, for example, around only 15 picofarads per square millimeter; a small series resistance of the pin diode; the pin diode is free of auto-doping layers, in particular in its central region, with the result that there are no slow charge carrier diffusion effects, and the n/p photodiode under it between the layer 20 and the layer 12 is short-circuited to thus avoid slow charge carrier diffusion effects from the substrate.

It is therefore intended that the foregoing detailed description be regarded as illustrative rather than limiting, and that it be understood that it is the following claims, including all equivalents, that are intended to define the spirit and scope of this invention.

The invention claimed is:

1. A method for producing an integrated circuit arrangement comprising a pin diode and a bipolar transistor, the method comprising:
  producing a first doped region for a pin diode in a substrate;
  producing an epitaxial layer with a thickness of at least 5 micrometers after the region for the pin diode has been produced;
  implanting a buried connection region for connecting a bipolar transistor after the epitaxial layer has been produced;
  producing a second doped region of the pin diode, the second doped region including a conduction type opposite to the conduction type of the region of the pin diode which was produced first in the epitaxial layer; and
  producing a bipolar transistor including an edge region that adjoins the connection region in the epitaxial layer.

* * * * *